United States Patent [19]
Segal

[11] Patent Number: 5,790,830
[45] Date of Patent: Aug. 4, 1998

[54] EXTRACTING ACCURATE AND EFFICIENT TIMING MODELS OF LATCH-BASED DESIGNS

[75] Inventor: Russell B. Segal, Sunnyvale, Calif.

[73] Assignee: Synopsys, Incorporated, Mountain View, Calif.

[21] Appl. No.: 580,658

[22] Filed: Dec. 29, 1995

[51] Int. Cl.$^6$ .................................................. G06F 17/50
[52] U.S. Cl. .......................... 395/500; 364/578; 364/488; 364/489; 364/490
[58] Field of Search ....................... 364/578, 488, 364/489, 490, 491; 395/500

[56] References Cited

U.S. PATENT DOCUMENTS

| | | | |
|---|---|---|---|
| 4,590,581 | 5/1986 | Widdoes, Jr. | 364/578 |
| 4,829,446 | 5/1989 | Draney | 364/488 |
| 5,084,824 | 1/1992 | Lam et al. | 364/490 |
| 5,095,454 | 3/1992 | Huang | 364/578 |
| 5,111,413 | 5/1992 | Lazansky et al. | 364/578 |
| 5,259,006 | 11/1993 | Price et al. | 375/107 |
| 5,278,769 | 1/1994 | Bair et al. | 364/490 |
| 5,377,122 | 12/1994 | Werner et al. | 364/488 |
| 5,452,225 | 9/1995 | Hammer | 364/488 |
| 5,517,136 | 5/1996 | Harris et al. | 326/93 |
| 5,544,066 | 8/1996 | Rostoker et al. | 364/489 |
| 5,555,201 | 9/1996 | Dangelo et al. | 364/489 |
| 5,572,436 | 11/1996 | Dangelo et al. | 364/489 |
| 5,572,437 | 11/1996 | Rostoker et al. | 364/489 |

OTHER PUBLICATIONS

Brian Ebert et al., "SeeSaw: A Verilog Synthesis Viewer," 2nd Annual International Verilog HDL Conference, Design Excellence for Today and Tomorrow; Santa Clara, CA, Mar. 22, 1993, pp. 55–60.
U.S. application Ser. No. 08/751,132, Segal Nov. 15, 1996.

*Primary Examiner*—Emanuel Todd Voeltz
*Assistant Examiner*—Vuthe Siek
*Attorney, Agent, or Firm*—Graham & James LLP

[57] ABSTRACT

A method and an apparatus for constructing a model of a digital circuit which contains level sensitive latches. The model allows for time borrowing amongst latches. Chains of latches or latch paths are collapsed together. The resulting model can be used for simulation or synthesis.

22 Claims, 13 Drawing Sheets

EXTRACTING ACCURATE AND EFFICIENT TIMING MODELS OF LATCH-BASED DESIGNS

RELATED APPLICATIONS

BACKGROUND

FIELD OF THE INVENTION

This invention relates to the field of computer aided design for digital circuits, particularly to modeling the timing characteristics of digital circuits which include latches. This invention is used for designing and verifying the functionality of digital circuits before they are fabricated. In particular, the invention aids in the problem of simulation and verification of the timing behavior of a digital circuit.

STATEMENT OF THE RELATED ART
Timing Verification

Timing verification takes two forms. "Timing simulation" verifies the behavior of an electronic circuit by emulating the circuit's function via a computer program. Stimulus is presented to the program and the program is expected to behave in a manner similar to the intended circuit. "Static timing analysis" uses a computer program to analyze the structure of the circuit by analyzing a representation stored in memory. The analysis determines the worst possible timing behavior for the circuit and compares that behavior to the worst acceptable behavior to check for discrepancies.

In both timing verification schemes, "timing models" are sometimes used. Timing models are blocks of computer data which can be used to recreate the timing behavior of an electronic circuit. Timing models can vary in complexity, depending on the of circuit they represent, ranging from a single transistor to an entire computer system. Timing models also vary in size (amount of space they take in a computer memory) and accuracy. In general, the more accurate or complex a model, the bigger it will be. Timing models are generally represented as simplified circuits in type of computer program. Thus, the program can use the same routines for both the original circuit and the timing model.

It is of interest to make the size of timing models as small as possible for a given complexity of circuit, while maintaining the accuracy of the model. In general, a smaller model will not only require less space in a computer memory, but also will be faster for a computer to evaluate. Often, a model's accuracy will be sacrificed to shrink the model and speed its evaluation. This is especially important for large models which represent an entire subcircuit of an electronic system.

Port-to-Port Timing Models

A popular technique for shrinking a timing model involves the creation of a "port-to-port" model. This technique involves analyzing an electronic circuit to isolate and maintain only the timing behavior that can be observed at the circuit's connections to surrounding circuits (the "connections" are often called "ports"). So any timing behavior of a circuit that is only internal to that circuit is discarded, leaving only the information which essential to verifying the timing behavior of the circuit in the context of surrounding circuits. Port-to-port timing models have been used in both timing simulation and static timing analysis. The models are accurate, and generally provide good compression of model size.

FIG. 2 is a block diagram showing a representation in memory of a digital circuit which contains a multiplicity of input signals (201, 202, 203, 204), output signals (205, 206, 207, 208), combinational logic (209, 210, 211), and edge-triggered (or master-slave) flip-flops (212, 213). A flip-flop is an electronic device which is controlled by a clock signal. At the instant the value of its clock signal changes, a flip-flop passes the value of its data signal to its output signal. At other times, the flip-flop holds the value of its output signal constant. The connecting lines in FIG. 2 represent electrical connections in the circuit. A port-to-port timing model can be used to represent a this digital circuit as shown in FIG. 3 and FIG. 4.

In port-to-port modeling, the electronic circuit is analyzed to determine the longest time that it will take for an electronic signal to pass from each input port to each output port. Often the shortest time is determined as well. A flip-flop in the circuit acts much like an internal port and is also considered a start point and an end point for electronic signals. Analysis is also done to determine the longest time that it will take for an electronic signal to pass from each input port to the input signals of each flip-flop and from the output signal of each flip-flop to each output port. Once this analysis has taken place, the details of the combinational logic are no longer necessary and can be discarded, resulting in a "partial port-to-port" model, as shown in FIG. 3.

Edge triggered flip-flops have the property of being controlled by an electronic signal called a "clock". When this clock signal changes voltage levels, all flip-flops which are controlled by that clock perform their function. Because many flip-flops connected to a single clock function simultaneously, the flip-flops connected to a single clock many be "collapsed" into one flip-flop 414 in the port-to-port timing model. The result is a "full port-to-port" model as shown in FIG. 4, where only the longest path between pins and the single collapsed flip-flop is important. Because there are usually a multitude of flip-flops in an electronic circuit, collapsing flip-flops results in a large compression of the model's size.

There are many digital circuits that use a device called a "transparent latch" in place of flip-flops. Like a flip-flop, a transparent latch, also called a "latch", is controlled by a clock signal. Flip-flops are active only at the instant its clock signal changes; a latch is can be active at any time that its clock signal remains at a high voltage. Some latches are active when there clock signals are at low voltage, instead of high voltage, but the processes are the same. The remainder of this document discusses latches that are transparent when the clock is high but it will be apparent to one skilled in the art that the techniques described also apply to latches that pass values when the clock is low.

When the clock signal transitions from high to low the latch "latches" the input data and holds that value on the output until the clock transitions back to high again. The input data is fed to the latch via the latch's "D pin." The D pin may also be called the "data pin." The output of the latch is available on the latch's "Q pin." The clock signal is connected to the latch via the "clock pin."

Due to the physical characteristics of the electronic circuitry from which physical latches are implemented, the transition between when the latch is transparent and when it holds its value is not instantaneous. Therefore, the value on the data pin must be available a certain amount of time before the clock signal transitions to a low voltage. This time is called the "setup time." Routines that verify that the data is, available early enough to meet the setup time are called "setup checks" and violations are called "setup violations." In addition to the setup time, the data value must remain constant for a certain amount of time after the clock transitions to low. This time is called the "hold time." Routines that verify that the data is available long enough to meet the hold time are called "hold checks" and violations are called "hold violations." If a setup or a hold violation occurs, the latch might not contain a valid value. Thus, it is important that models accurately represent setup and hold times.

Conventionally, full port-to-port models have not been used to model electronic circuits which incorporate transparent latches. For circuits which contain transparent latches, conventional methods of generating port-to-port timing models use one of two techniques.

For one technique, partial port-to-port models are used, and all transparent latches of the original circuit are maintained in the model. This results in a model which is larger and slower to evaluate than a full port-to-port model.

In an alternate technique, the latches in the circuit are converted either to combinational logic or to edge-triggered flip-flops, and then normal port-to-port modeling techniques are applied. Using this technique, the full or partial port-to-port model will reproduce the timing behavior of the original electronic circuit only under a subset of possible stimuli. This means that the model is inaccurate, and the model might conservatively suggest that the modeled circuit has bad timing when the circuit might actually be correct.

The reason that this second technique produces models that are too pessimistic is that the latches in a circuit can "time borrow" amongst themselves. Time borrowing is possible when the combinational logic between two latches requires more time than the clock period to compute a stable value. However, if the logic following the second latch requires less than an entire clock period to compute a stable value, then the value computed by the first pair of latches need not become stable until some time after the clock signal goes high. The second set of logic will still have enough time to compute a stable value, even though its calculations did not begin until some time after the clock signal went high. Time borrowing is an essential technique for latch-based design. However, models based on latches which are converted to combinational logic or edge-triggered flip-flops do not include sufficient information to allow time borrowing.

SUMMARY OF THE INVENTION

An aspect of the present invention provides an apparatus and a method for generating a generalized, full pin-to-pin timing model for a digital circuit which can be used to accurately verify the timing behavior of said digital circuit, even when the circuit contains transparent latches. The process may be applied manually, or may be programmed as a subroutine for execution by a computer. The timing model generated is suitable for use in a timing simulator, static timing analyzer, or other system which evaluates digital circuit timing.

In order to correctly reproduce the behavior of latches from a digital circuit when making a timing model, one must consider "latch paths." Latch paths are sequences of latches that may be separated by combinational logic. Each latch in the path is controlled by a clock signal. A clock signal may be common to several latches in the path, or a latch may have a clock signal that is unique to it.

In one embodiment of this invention, a computer program analyzes a digital circuit representation to find all latch paths which connect from input pin to output pin. Then rather than collapsing together single latches (as suggested by the standard pin-to-pin modeling process), similar latch paths are collapsed together. Two latch paths are considered to be similar if they share the same sequence from input pin to output pin. When two or more paths are collapsed together to create a single path, an evaluation is made to determine the longest possible time for an electronic signal to propagate through the latch path. Only that longest propagation time is preserved in the model, but that is enough to ensure that the model correctly emulates the timing behavior of the original circuit. Furthermore, use of latch paths enables time borrowing amongst the latches of the model because the relationships between the latches are preserved.

In one embodiment of this invention, latch paths are truncated to be less than a certain predetermined length, where length is defined to be the number of latches in the path. As in the first embodiment, latch paths (although truncated) which share the same sequence are collapsed together, but the models of the second embodiment will be smaller.

A BRIEF DESCRIPTION OF THE DRAWINGS

The accompanying drawings, which are incorporated in and constitute a part of this specification, illustrate several embodiments of the invention and, together with the description, serve to explain the principles of the invention.

Figure 13A:
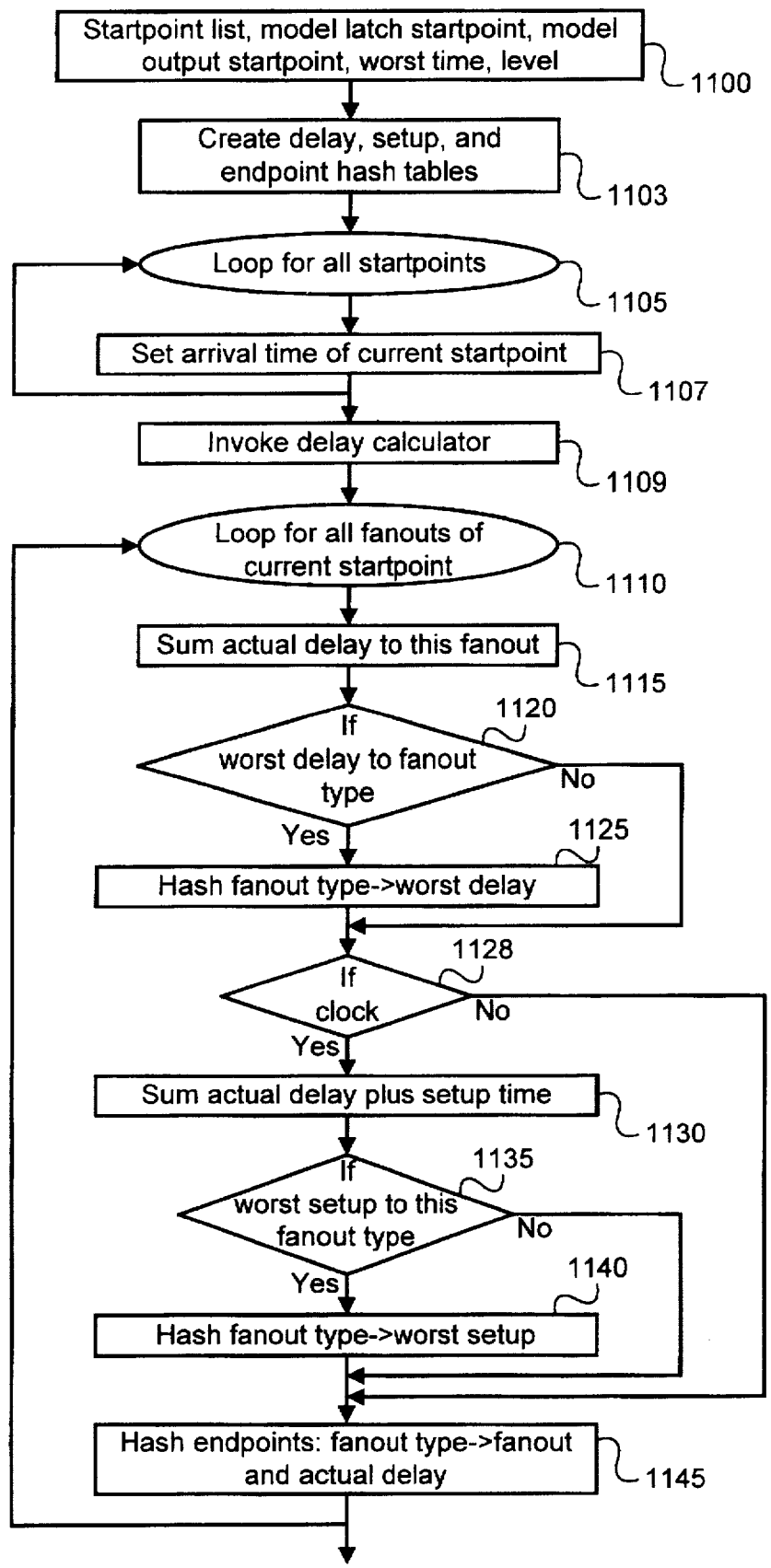

FIG. 13(a) and (b) is a flow chart showing steps for recursing through the circuit to create the remainder of the model.

Figure 6:
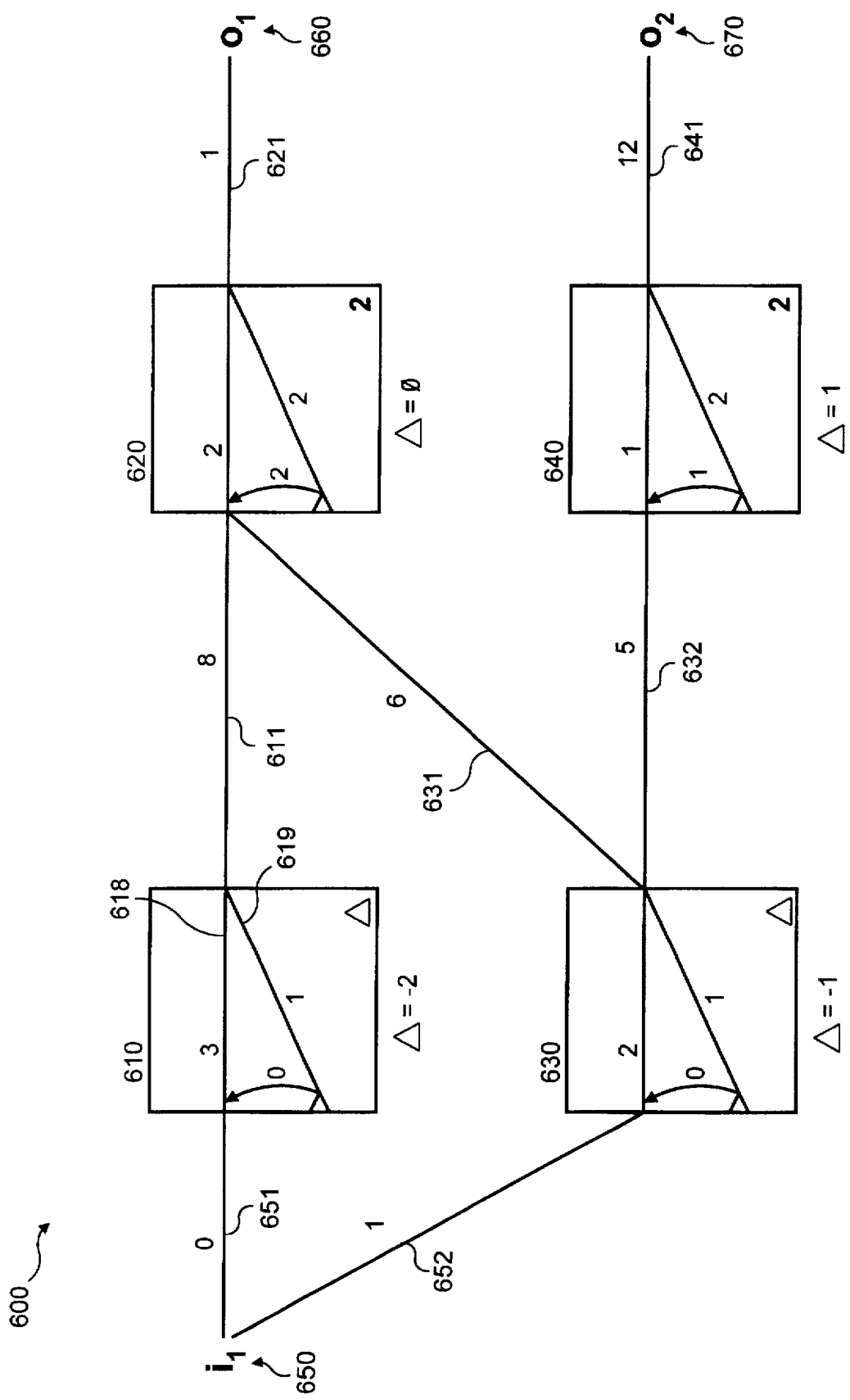
FIG. 6 is a block diagram which shows a representation of a digital circuit and the delays between the inputs, outputs, and latches of the digital circuit.
Figure 14:
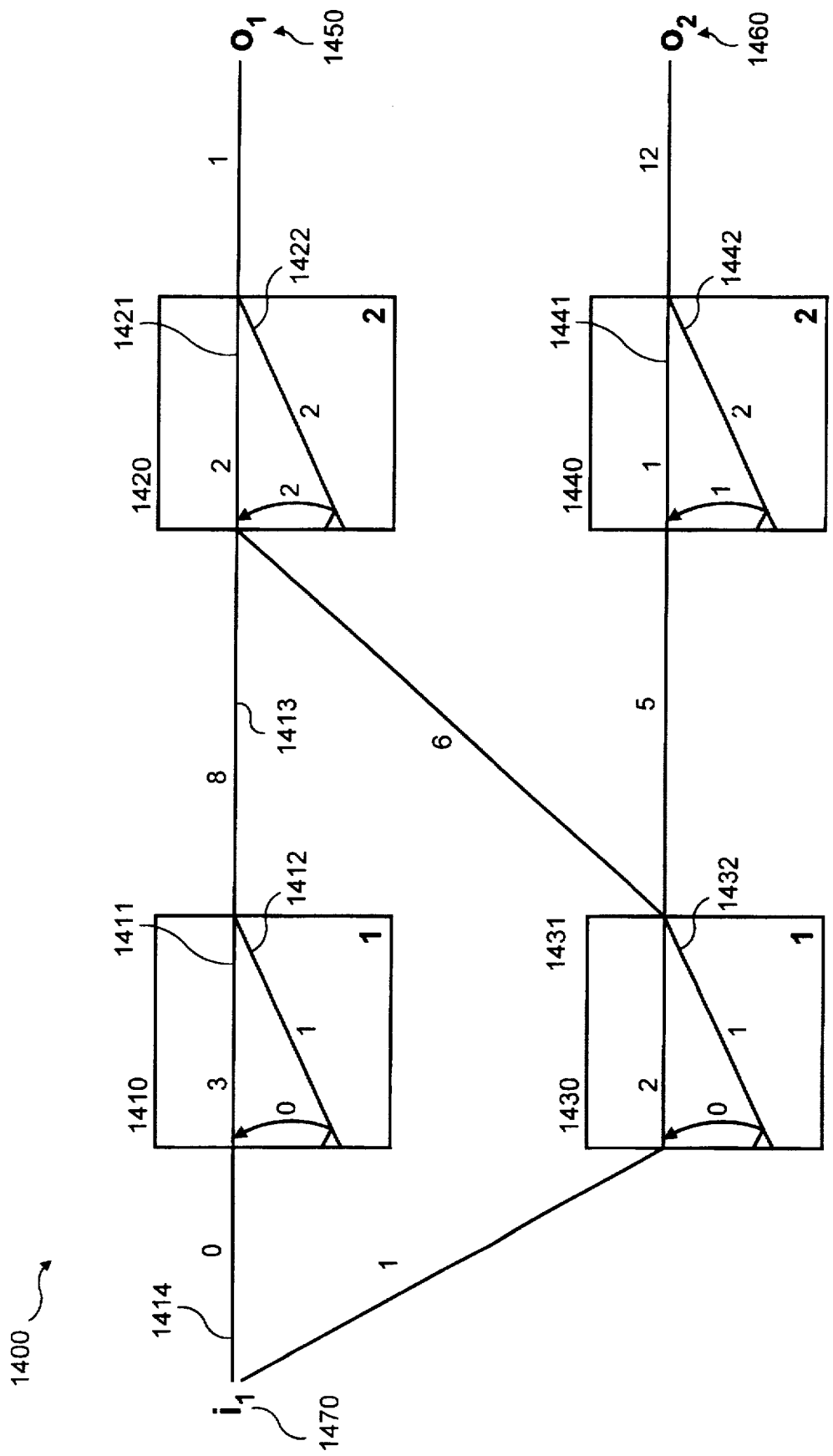

FIG. 14 is a block diagram showing a representation of the intermediate model for the digital circuit of FIG. 6 before the delta calculations are performed.

DETAILED DESCRIPTION OF THE INVENTION

The present invention comprises a novel apparatus and method for analyzing a digital circuit which contains latches and creating a model of its timing characteristics. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

1.0 Computer System Description

Figure 1:
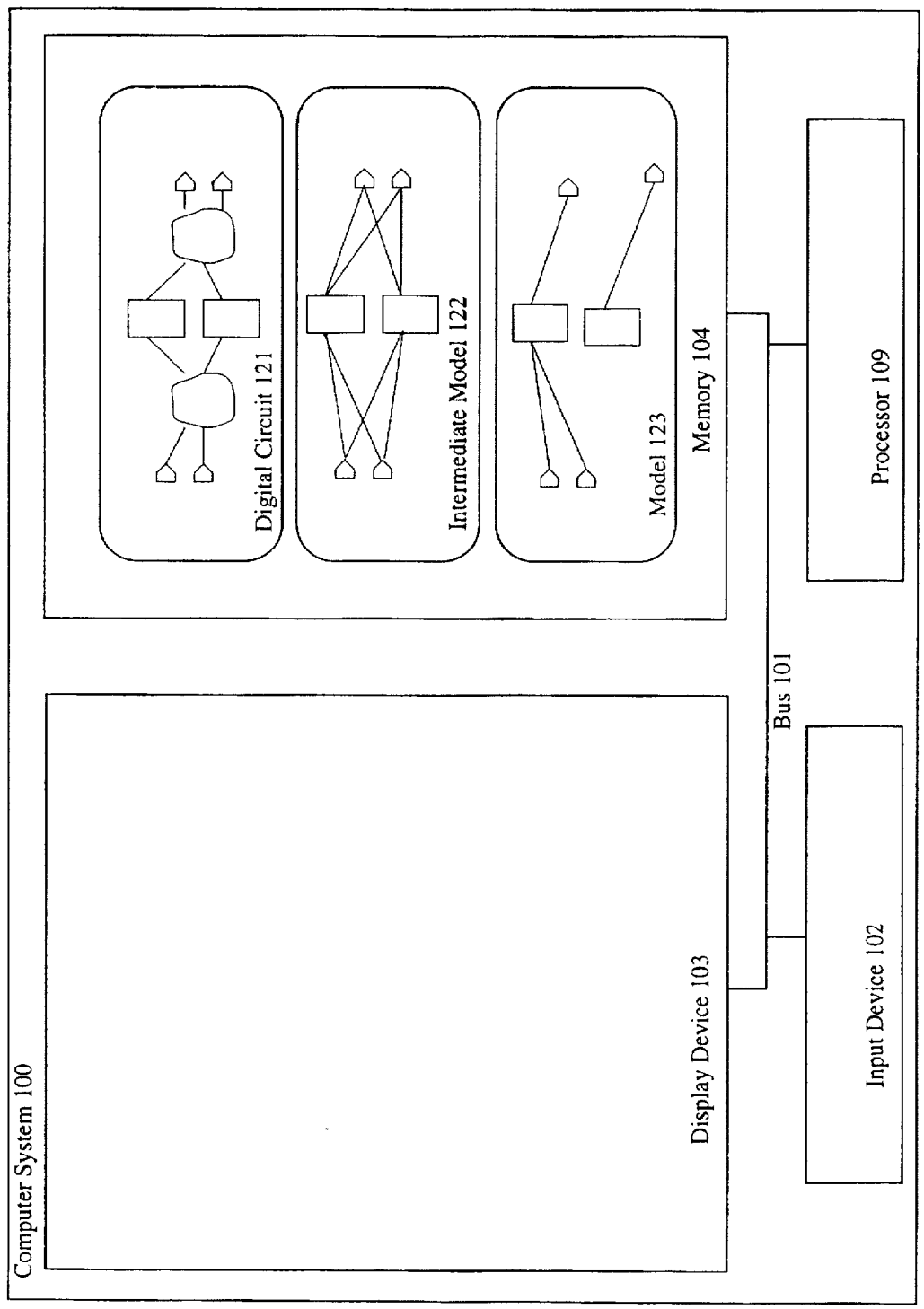
FIG. 1 is a block diagram showing a computer system in accordance with the present invention.
Figure 2:
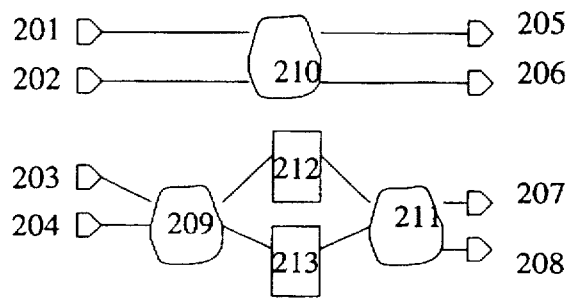
FIG. 2 is a block diagram showing a representation of a digital circuit in a memory of FIG. 1.
Figure 3:
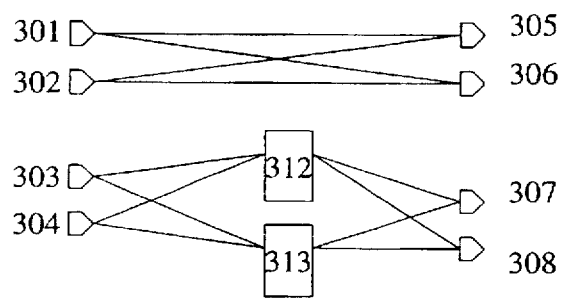
FIG. 3 is a block diagram showing a conventional representation of a partial pin-to-pin timing model.
Figure 4:
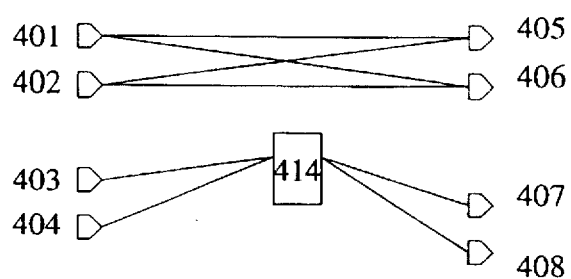
FIG. 4 is a block diagram showing a conventional representation of a fall pin-to-pin timing model.

FIG. 1 illustrates a computer system 100 in accordance with a preferred embodiment of the present invention. It will be apparent to a person of ordinary skill in the art that computer system 100 can also include numerous elements not shown in the figure for the sake of clarity, such as disk drives, network connections, etc. The computer system 100 includes a bus 101, or other communications hardware and software, for communicating information, and a processor 109, coupled with the bus 101, is for processing information. The processor 109 can be a single processor or a number of individual processors that can work together. The computer system 100 further includes a memory 104. The memory 104 can be random access memory (RAM), or some other dynamic storage device. The memory 104 is coupled to the bus 101 and is for storing information and instructions to be executed by the processor 109. The memory 104 also may be used for storing temporary variables or other intermediate information during the execution of instructions by the processor 109.

Memory 104 includes both software and data. Specifically, the software in memory 104 includes representations of a digital circuit 121, an intermediate model 122, and a port-to-port model 123.

The computer system 100 can also include a display device 103 for displaying information to a user. The display device 103 can be coupled to the bus 101. The display device 103 can include a frame buffer, specialized graphics rendering devices, a cathode ray tube (CRT), and/or a flat panel display. The bus 101 can include a separate bus for use by the display device 103 alone.

An input device 102, including alphanumeric and other keys, is typically coupled to the bus 101 for communicating information, such as command selections, to the processor 109 from a user. The input device may also include a mouse or touchpad.

2.0 Definitions

A digital circuit, also called a circuit is an interconnected collection of parts. Parts may also be called cells. The digital circuit receives signals from external sources at points called primary inputs or inputs. The digital circuit produces signals for external destinations at points called primary outputs or outputs. Primary inputs and primary outputs are also called ports. Each part receives input signals and computes output signals. Each part has one or more pins for receiving input signals and producing output signals. In general, pins have a direction. Most pins are either input pins, which are called loads, or output pins, which are called drivers. Some pins may be bidirectional pins, which can be both drivers and loads.

Two or more pins from one or more parts or primary inputs or primary outputs are connected together with a net. Each net establishes an electrical connection among the connected pins, and allows the parts to interact electrically with each other. Pins are also connected to primary inputs and primary outputs with nets. For the sake of simplicity, parts may be said to be "connected" to nets, but it is actually pins on the parts which are connected to the nets.

A Circuit Element is any component of a circuit. Ports, pins, nets, and cells are all circuit elements. Any circuit element which is an input to another circuit element is said to drive that circuit element. Any circuit element which is an output of another circuit element is said to load that circuit element. For example, drivers drive a signal onto a net; loads load nets with capacitance.

A digital circuit design can be stored in memory of a computer system using data structures which represent the various components of the circuit. The data structures have the same name as the physical components. In this document, parts, cells, nets, pins, and other digital circuit components refer to the software representation of the physical digital circuit component.

A digital circuit can be specified hierarchically. Some or all of the parts in the digital circuit may themselves be digital circuits composed of more interconnected parts. When a high level part is specified as a digital circuit composed of other, lower level parts, the pins of the high level part become the primary inputs and primary outputs for the digital circuit comprising the lower level parts. When a high level part is composed of lower level parts, it is called a level of hierarchy. Levels of hierarchy can be replaced by models such as those created using the methods described in this document.

Following are additional definitions of terms which are used in this document.

The Fanout of a circuit element includes any circuit elements which are driven by that circuit element. The transitive fanout of a circuit element includes all of the circuit elements in the circuit which are driven, either directly or indirectly, by that circuit element. Thus, the transitive fanout of a circuit element includes the fanout of that circuit element, as well as the fanout of each of the circuit elements in the original fanout, and so on.

The Fanin of a circuit element includes any circuit elements which drive that circuit element. The transitive fanin of a circuit element includes all of the circuit elements in the circuit which drive, either directly or indirectly, that circuit element. Thus, the transitive fanin of a circuit element includes the fanin of that circuit element, as well as the fanin of each of the circuit elements in the original fanin, and so on.

A model latch is a data structure in the memory of a computer system, or collection of data structures, used to represent a latch in a port-to-port model. In one embodiment, a model latch uses the same data structure as a latch in a digital circuit. The model latch has a D pin, a Q pin, and a clock pin. Model latches may also contain additional pins such as a Q bar pin. It may also contain timing arcs between the pins. These timing arcs may indicate the delay to propagate a signal from the source pin to the destination pin. Timing arcs may also indicate setup delays on the rising or falling edge of the clock. In an alternate embodiment, a model latch is represented by a collection of pins and timing arcs, but does not have any structure itself. In this embodiment, pins are not created unless they have timing arcs connected to them. For example, a model latch might consist of a D pin, a clock pin, and a timing arc between them, but no Q pin if the latch does not drive any other element. For the sake of clarity, this document describes model latches as single elements. However, it will be apparent to one skilled in the art that the alternate embodiment may also be used.

Like a model latch, a model flip-flop can be represented as data structure for a flip-flop with a D pin, a Q pin, and a clock pin, with timing arcs between the pins. In an alternate embodiment, a model flip-flop can be a collection of pins and timing arcs.

The terms model input, model output, and model arc are used to distinguish clearly between the structures in the original digital circuit and the structures constructed for the model. Each of these structures corresponds to the same type of structure in the original circuit. Model inputs and outputs are respectively primary inputs and outputs to the model. Model arcs are timing arcs inside the model.

Figure 5:
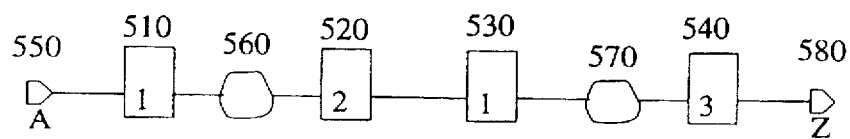
FIG. 5 is a block diagram which shows an example of a representation of a latch path.

Latch paths are sequences of latches that may be separated by combinational logic. Each latch in the path is controlled by a clock signal. A clock signal may be common to several latches in the path, or a latch may have a clock signal that is unique to it. FIG. 5 shows a sample latch path. For purposes of notation, the figures show a number on each latch. Each unique number indicates that the latch is controlled by a unique clock signal. If two latches share the same number, they are controlled by the same clock signal. The latch path shown in FIG. 5 has four latches, controlled by clock signals 1, 2, 1, and 3 in order. We define the latch path's "sequence" to be 1-2-1-3. It is useful to define latch paths which may start at input pins or may end at output pins. In the example, the latch path which includes pins would have the sequence A-1-2-1-3-Z.

For instance, if the latch path in FIG. 5 were to be truncated to length 3, it would be A-1-2-1 (input 550 to latch 510 to latch 520 to latch 530). Another possible truncated latch path from the example would be the last three latches of the full path: 2-1-3-Z (latch 520, latch 530, latch 540, output 580).

3.0 Collapsing Latch Paths

This section describes intuitively how models are created by collapsing latch paths. The intention is to demonstrate the relationship between the original digital circuit and the model. Details of a method performed by computer 100 for creating such models will be described in a later section.

The difficulty in creating a full port-to-port timing model for circuits that contain transparent latches stems from the fact that it is difficult to collapse the latches and still preserve an accurate representation of the circuit. A latch can be active at any time that its clock signal remains at a high voltage. (Some latches are active when their clock signals are low voltage, instead of high voltage, but the processes are the same.) The uncertainty associated with the exact time that a latch operates makes it difficult to collapse a given latch with other latches. By collapsing two latches together for purposes of creating a model, we make the implicit assumption that both latches are active at the exact same time. If the latches of the circuit we are modeling are not active at the same time, the generated model will be inaccurate.

A latch path is a path through the circuit which includes one or more latches, and may also include a input and/or an output. Because latches are active the entire time that their clock is high, they can "time borrow" from other latches on the path. Thus, the combinational logic between two latches may require more than one clock cycle to compute a valid value, if the combinational logic following the second latch does not require an entire cycle, or the combinational logic driving the first latch can compute a valid value early. Therefore, the present invention collapses latch paths, rather than individual latches.

In a preferred embodiment, the maximum length of each collapsed latch path is limited to a finite number of latches, "n." This maximum latch path length can have any value greater than or equal to zero. Typical values of the maximum latch path length might range between 0 and 3, but are not limited to these values. By limiting the maximum latch path length, the routines which build the model do not need to process feedback loops in the latch paths of the original circuit specially. In a preferred embodiment, the latch path length is specified by the user when the model is created. In an alternate embodiment, the latch path length is not limited. This is equivalent to setting "n" to infinity. Models can be built using an unlimited latch path length. However, any cycles in the original circuit must be broken using conventional techniques before the circuit is modeled.

In a preferred embodiment, the last latch in each latch path is marked so that it cannot time borrow. In a preferred embodiment, latches are marked as unable to time borrow by constraining the data to arrive at or before the clock. This implies that the data signal may not arrive after the clock signal, and thus the latch may not time borrow.

3.1 Example Circuit

FIG. 6(a) shows a representation of a digital circuit 600 stored in memory 104 and the delays between the inputs, outputs, and latches of a digital circuit. The circuit has one input $i_1$ 650, two outputs, output $o_1$ 660 and output $o_2$ 670, four latches. The clock of each latch is indicated by a number in its lower right corner. Latch 610 and latch 630 are clocked by clock 1, and latch 620 and latch 640 are clocked by clock 2. Each of arc 651, arc 652, arc 611, arc 631, arc 632, arc 621 and arc 641 has a delay associated with it. The delays are incurred by combinational logic that connects the latches. For the sake of simplicity, the details of the combinational logic are not shown; instead, only the longest delay through the combinational logic is indicated by the number shown with each arc. The actual network used for modeling is derived from the delays along each latch path. The generated timing model is represented as a simplified digital circuit. The timing arcs are combined into strings of latches which represent the combined timing.

TABLE 1

| Latch Path Delays | |
| --- | --- |
| Latch Path | Max Delay |
| $i_1$->1->2->$o_1$ | 14 |
| $i_1$->1->2->$o_2$ | 21 |
| 1->2->$o_1$ | 14 |
| 1->2->$o_2$ | 20 |
| 2->$o_1$ | 3 |
| 2->$o_2$ | 13 |
| $i_1$->1->2 | 11 |
| $i_1$->1 | 1 |
| 1->2 | 11 |

Table 1 shows the latch path delays through the digital circuit 600 of FIG. 6. All of the possible latch paths through the digital circuit 600 and their delays are shown. A chain is made for each start to end point path, such as for $i_1$-1-2-$o_1$. In a generated model, the delay values for each of the arcs between model latches are derived by starting with the first segment ($i_1$-1 for this path) and simply using its value. Then the other segments are derived by subtracting the previous value. So the second arc has the value "$i_1$-1-2"–"$i_1$-1". The third has the value "$i_1$-1-2-$o_1$"–"$i_1$-1-2", etc. This chain of latches models setup checks for paths from $i_1$ to clock1, setup checks for $i_1$ through a transparent clock1 latch to clock2, and the max delay from $i_1$ through two transparent latches to $o_1$.

3.2 Example Model

Figure 7:
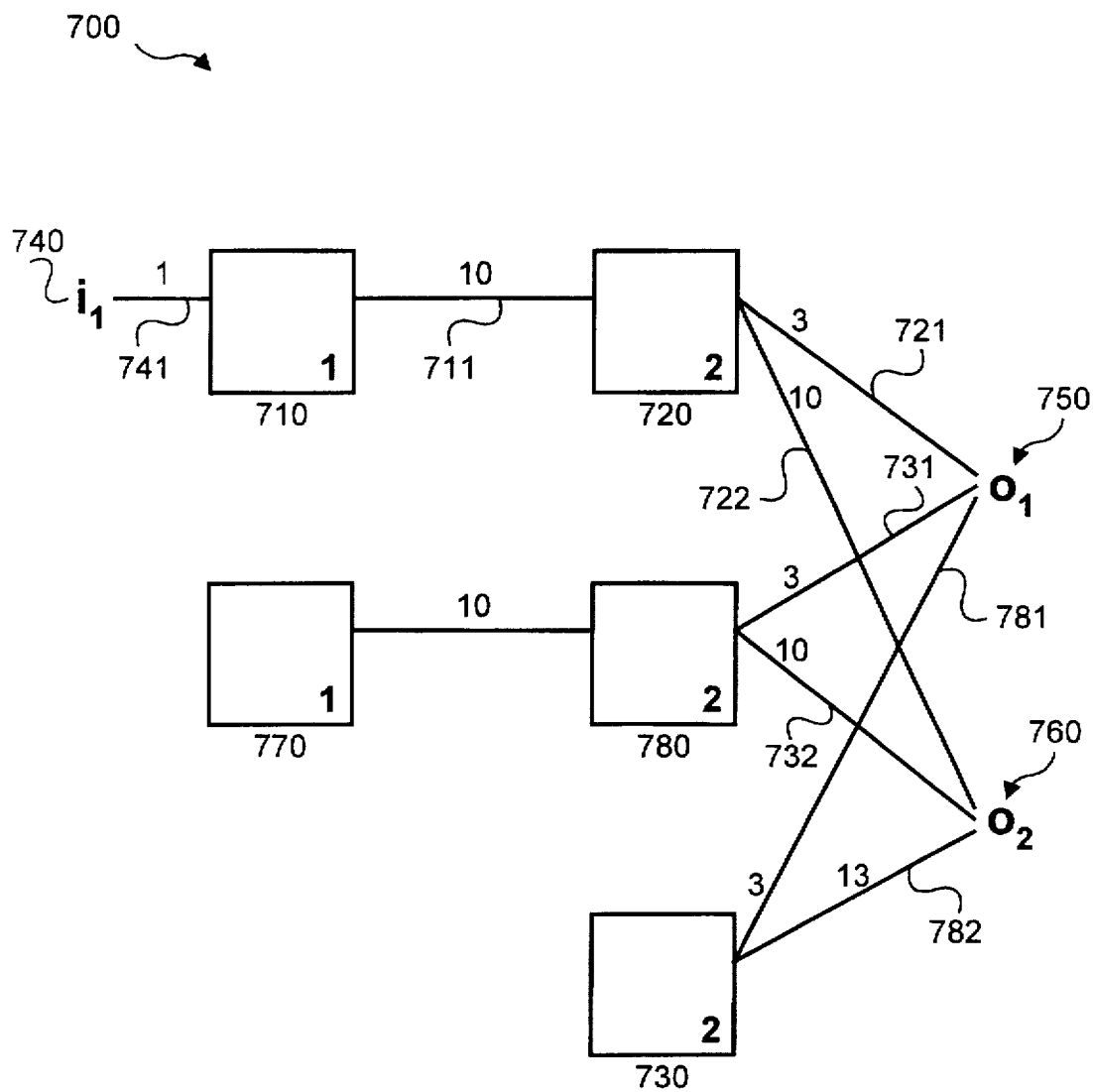
FIG. 7 is a block diagram which shows a pin-to-pin timing model for the digital circuit of FIG. 6.

FIG. 7 is a block diagram which shows a full port-to-port timing model 700 stored in memory 104 for the digital circuit 600 of FIG. 6. As with the original digital circuit 600, the model 700 has one input $i_1$ 740, and two outputs $o_1$ 750 and $o_2$ 760. The model contains five latches, latch 710, latch 720, latch 730, latch 770, and latch 780. These latches, and the delays between them, make up the worst case of each of the possible latch paths through the digital circuit 600. Note that the model 700 includes or uses in calculation all of the delays shown in Table 1. This sample model is intended to convey the relationship between the original digital circuit 600 and the delays shown in Table 1. Subsequent sections will further elaborate the actual construction of the model to account for additional effects. This sample model is intended to demonstrate the concept of latch paths.

In this simple example, the model 700 actually includes more latches than the original digital circuit 600. In a real design there are usually many more latch paths which can be collapsed together than in this simple example. Thus, the model will usually have fewer latches than the original design, but will handle time borrowing because the relationships between the latches are preserved by the latch paths.

3.3 The Min-Delay Problem

Latch paths model the maximum delay between latches well. However, they fail to accurately model the minimum delay between a clock signal and the subsequent latch. This situation can cause the model to incorrectly show that there are hold violations in the digital circuit during timing verification because signals may appear to arrive earlier than they might actually. If a signal arrives too soon, the clock signal might not arrive in time to latch the proper signal value and a hold violation might occur. The following sections describe two methods for solving this problem.

3.3.0.1 Min-delay Latches

An additional set of model latches is created in memory 104 which contain the minimum delays on the arcs between them. These model latches are created by treating all latches on the same clock as flip-flops and collapsing them using prior art techniques such as those described in the background section of this application. Effectively, each latch is treated as a flip-flop and modeled without accounting for time-borrowing. As time borrowing is usually not considered important for minimum delay, this strategy is acceptable.

3.3.0.2 Output Latches

In order to correctly model the minimum delay, a model latch may only drive a single output. This restriction is necessary to ensure that the minimum delay between each output latch and the output it drives is modeled properly. An output latch is a model latch which drives an output port of the model. Although the worst case maximum delay in the model is accurate, special treatment is required to ensure that the minimum delays to the outputs are correct. Accurate minimum delays are necessary when the model is used as part of a larger circuit because some of the maximum delays calculated in the model might actually be less than the actual minimum delay in the original circuit. Note that this is necessary for output latches because the method for calculating latch paths may put a smaller delay between the output latch and its corresponding output than the actual minimum.

Each output latch includes 2 delays: the maximum delay as shown in the previous example and also the maximum delay from each latch on a given clock to each subsequent output. In an alternate embodiment, the minimum delay from each latch on a given clock to each subsequent output can also be used. Any value between the minimum and maximum delay from the arrival of the clock signal will ensure that hold violations will be accurately modeled. These delays are stored in memory 104 in association with the representation of their latches.

Figure 8:
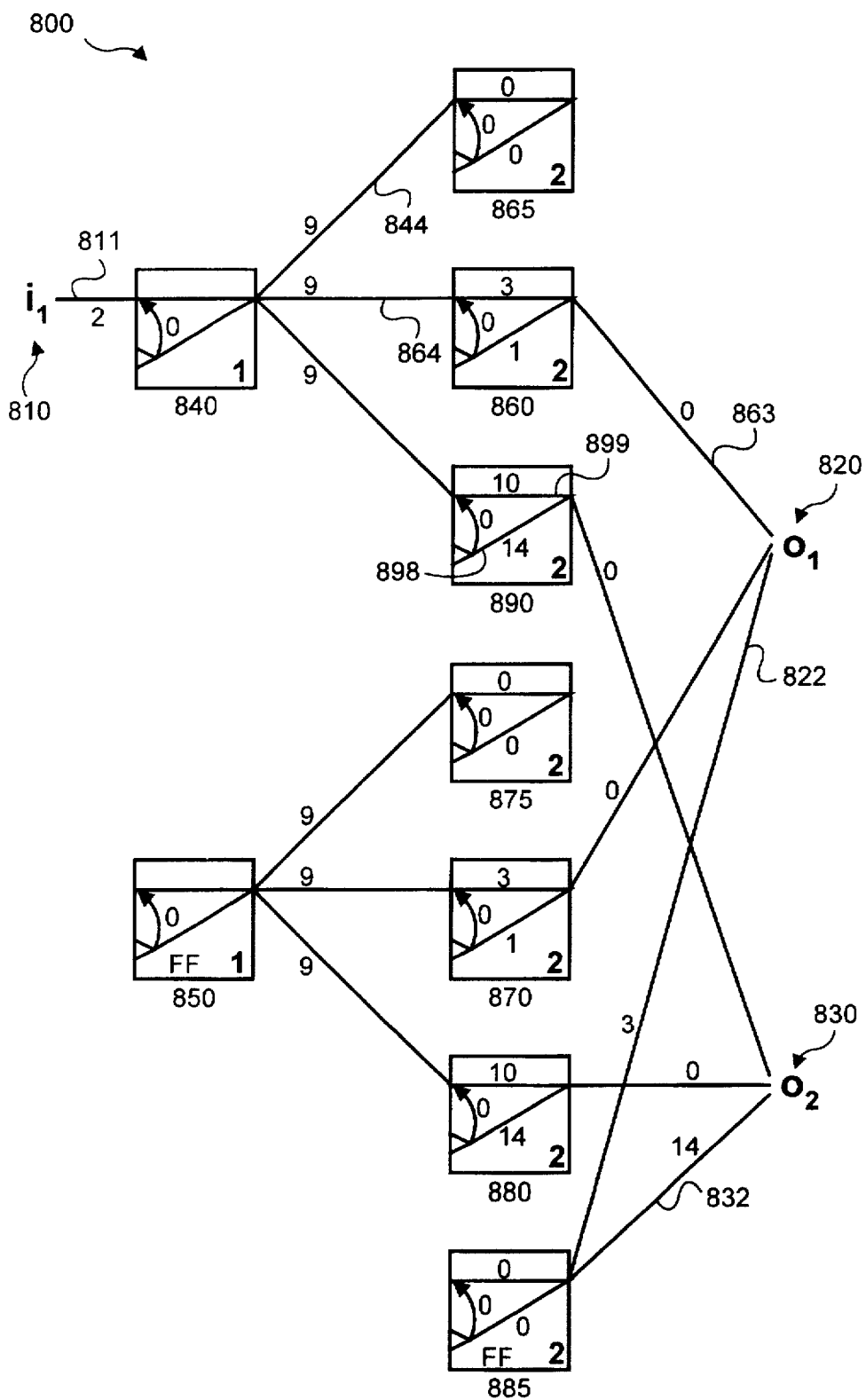
FIG. 8 is a block diagram which shows an alternate pin-to-pin timing model for the circuit of FIG. 6, including clock arcs and delta effects.

In a preferred embodiment, and as shown in FIG. 8, the two delays are stored as two arcs inside each latch which drives an output of the model. The path from the D pin to the Q pin has the maximum delay of the entire path from the D pin to the next timing latch or output. For other latches of the model, this delay is stored on the arc following the Q pin of the latch. For latches which drive outputs of the model, the path from the clock pin to the Q pin has the maximum delay from any latch with this clock to the next latch or output. Note that this system can increase the number of latches used in the model as there must be a separate latch driving each output.

FIG. 8 is a block diagram which shows the actual model 800 created for the circuit of FIG. 6. Note that each latch contains two timing arcs. In particular, note arc 899 on latch 890. Arc 899 goes from the clock pin to the Q pin of latch 890 and has delay 14. Arc 898 goes from the D pin to the Q pin of latch 890 and has delay 10. Arc 899 has a longer minimum delay than arc 898, and is thus necessary to accurately compute the minimum delay through latch 890 to $o_2$ 830.

The following sections describe a method for building a model such as the one shown in FIG. 8 and calculating the correct delays for the arcs.

4.0 Implementation

Each of the methods described in this section depend on the use of a delay calculator. Delay calculator software determines the delay between two points in a digital circuit. An example of a delay calculator is the DesignTime software available from Synopsys, Inc. in Mountain View, Calif. This section describes the method used to create an intermediate model of FIG. 9 and final model of FIG. 8. All models are represented as simplified digital circuit netlists. Several flow charts are used to show the steps. After the method has been fully described, an example is given that integrates all of the flow charts.

4.1 Intermediate Models and "Deltas"

Figure 9:
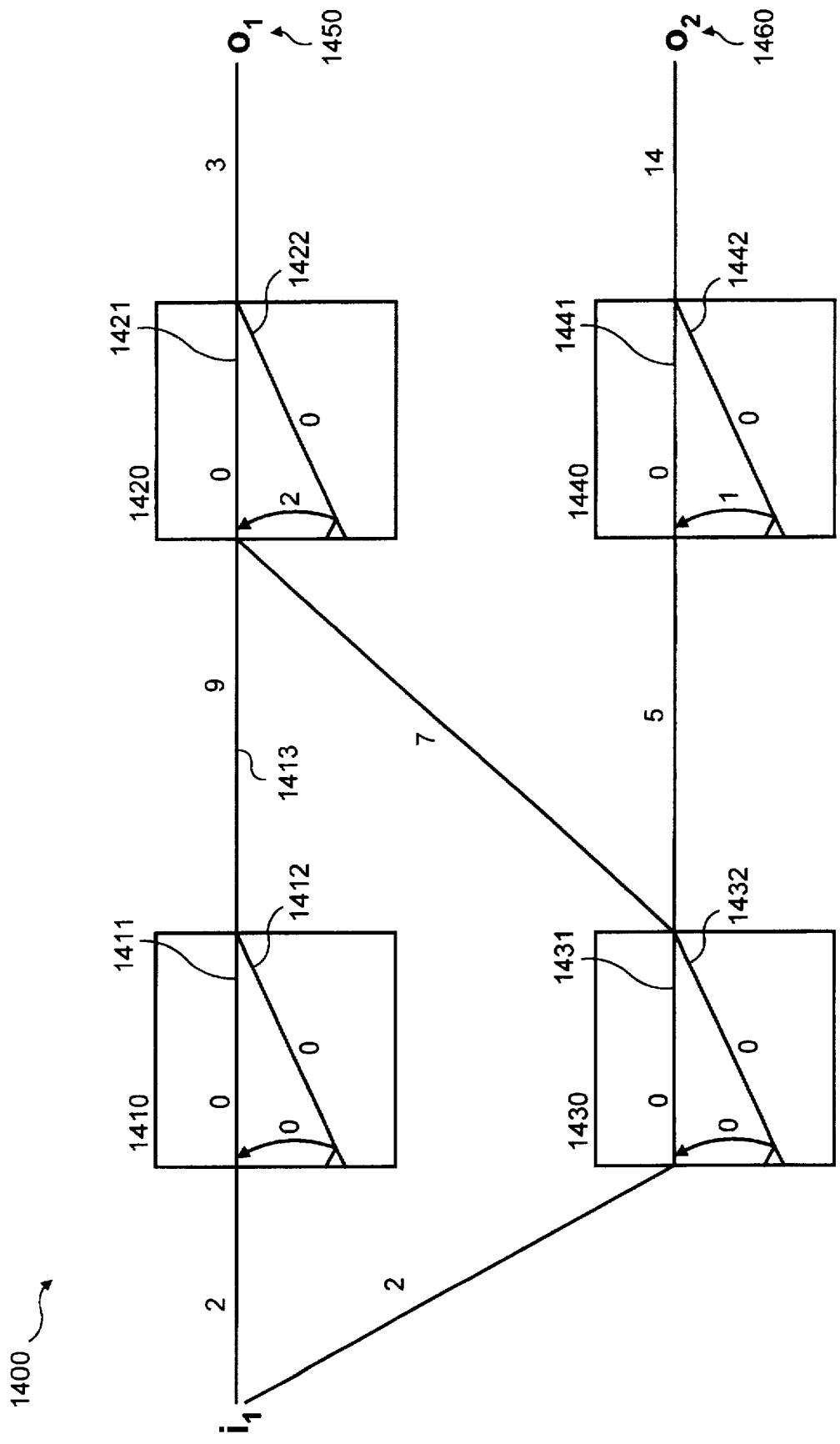
FIG. 9 is a block diagram showing a representation of an intermediate model for the digital circuit of FIG. 6 after the delta calculations are performed.

FIG. 9 is a block diagram showing a representation in memory 104 of an intermediate model for the digital circuit of FIG. 6. Use of an intermediate model reduces the complexity of the program code used to generate the final model, but can increase the runtime of the program. In an alternate embodiment, no intermediate model is created. In this case, all of the calculations which are performed as the intermediate model is created are performed during the creation of the final model. This option complicates the implementation. The intermediate model is created in two steps. First, a partial port-to-port model is created using prior art techniques. This partial port-to-port model includes all of the latches and flip-flops in the original circuit. However, the combinational logic is replaced with simple network arcs which connect the latches, flip-flops, inputs, and outputs. Each of these arcs includes the maximum delay through the combinational logic which it replaces. Next, the delays on the new arcs are adjusted by a "delta."

The delta is a number which indicates the difference between the clock and data delay through a latch. Specifically, delta=delay<clock→Q>−delay<D→Q>, where clock, D, and Q are pins in each latch. Once calculated, the delta will be used to balance the internal latch delays between the arcs which fan into and those which fan out of each latch. Use of a delta allows latches on the same clock to be combined into latch paths, even if latches with different internal delays are used in different parts of the design. Specifically, each delta is subtracted from the arc which drives each latch, and added to the arcs which fan out from each latch. This calculation ensures that the intermediate model has both the same overall delay through each latch, as well as the same relationship between the clock and data delays.

Figure 10:
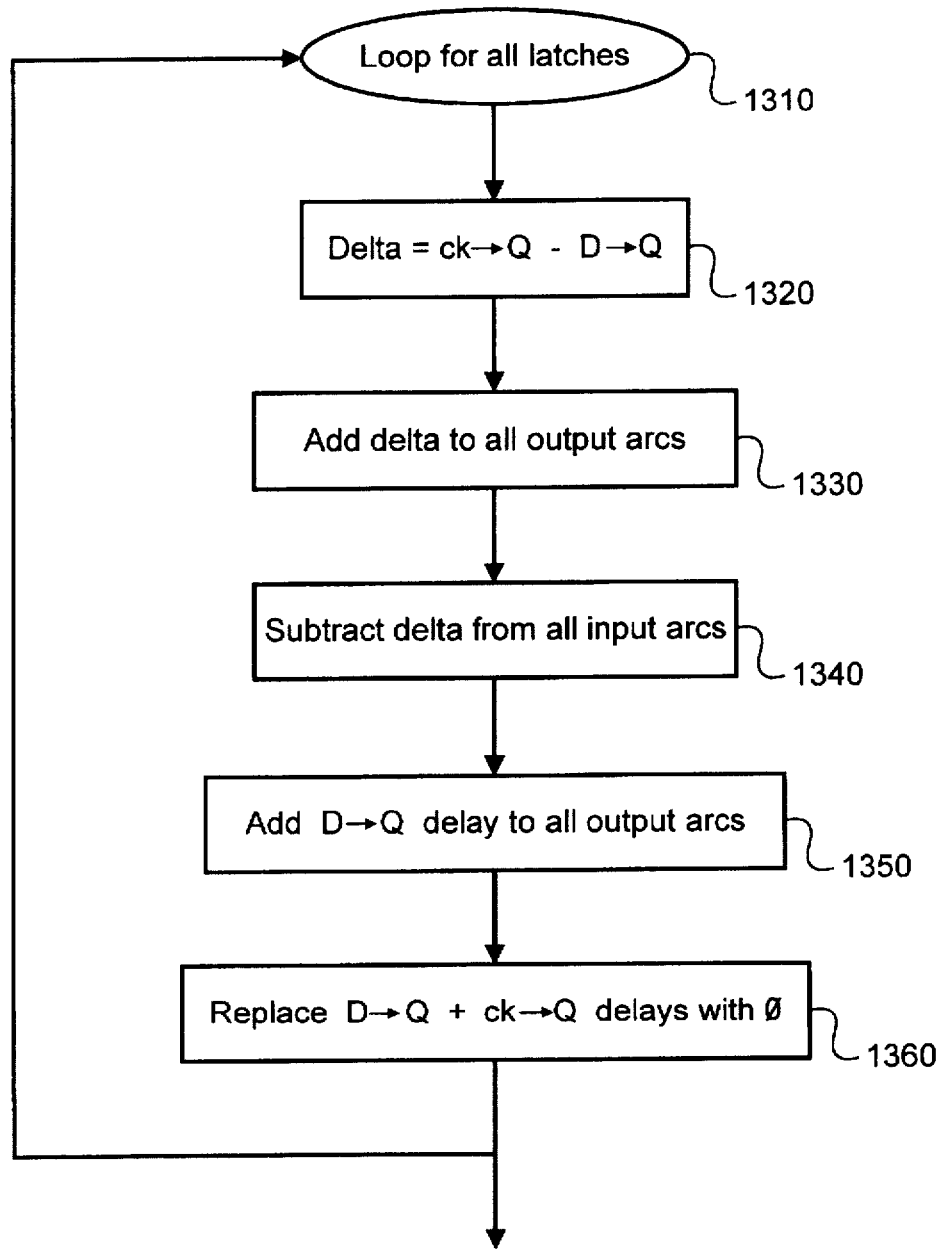
FIG. 10 is a flow chart showing steps for adjusting delays using a "delta" calculation.

FIG. 10 is a flow chart showing steps for adjusting the delays of arcs by the delta. In one embodiment the input to the method of FIG. 10 is an intermediate model such as shown in FIG. 9. In an alternate embodiment, it would be possible to perform the method of FIG. 10 on a copy of the original circuit as a pre-processing step so that the delays on the original arcs connected to the latches are adjusted. As mentioned above, in an alternate embodiment the delta calculation could be incorporated into the delay calculation as the actual model is created. It will be apparent to one skilled in the art that although such an calculation is possible, it complicates the implementation of building the final model.

Loop 1310 loops over all of the latches in the intermediate model. As each latch is processed, it is called the current latch.

Step 1320 calculates the delta for the current latch. As described above, the delta is the difference between the clock to Q and D to Q delays.

Step 1330 adds the delta to all of the output arcs to the current latch, that is all of the arcs which are connected to the current latch's Q pin.

Step 1340 subtracts the delta from all of the input arcs to the current latch, that is all of the arcs which are connected to the current latch's D pin.

Step 1350 adds the D to Q delay to all of the output arcs to the current latch.

Step 1360 replaces the D to Q and clock to Q delays in the current latch with 0.

4.2 Calculating Maximum Delays

Figure 11:
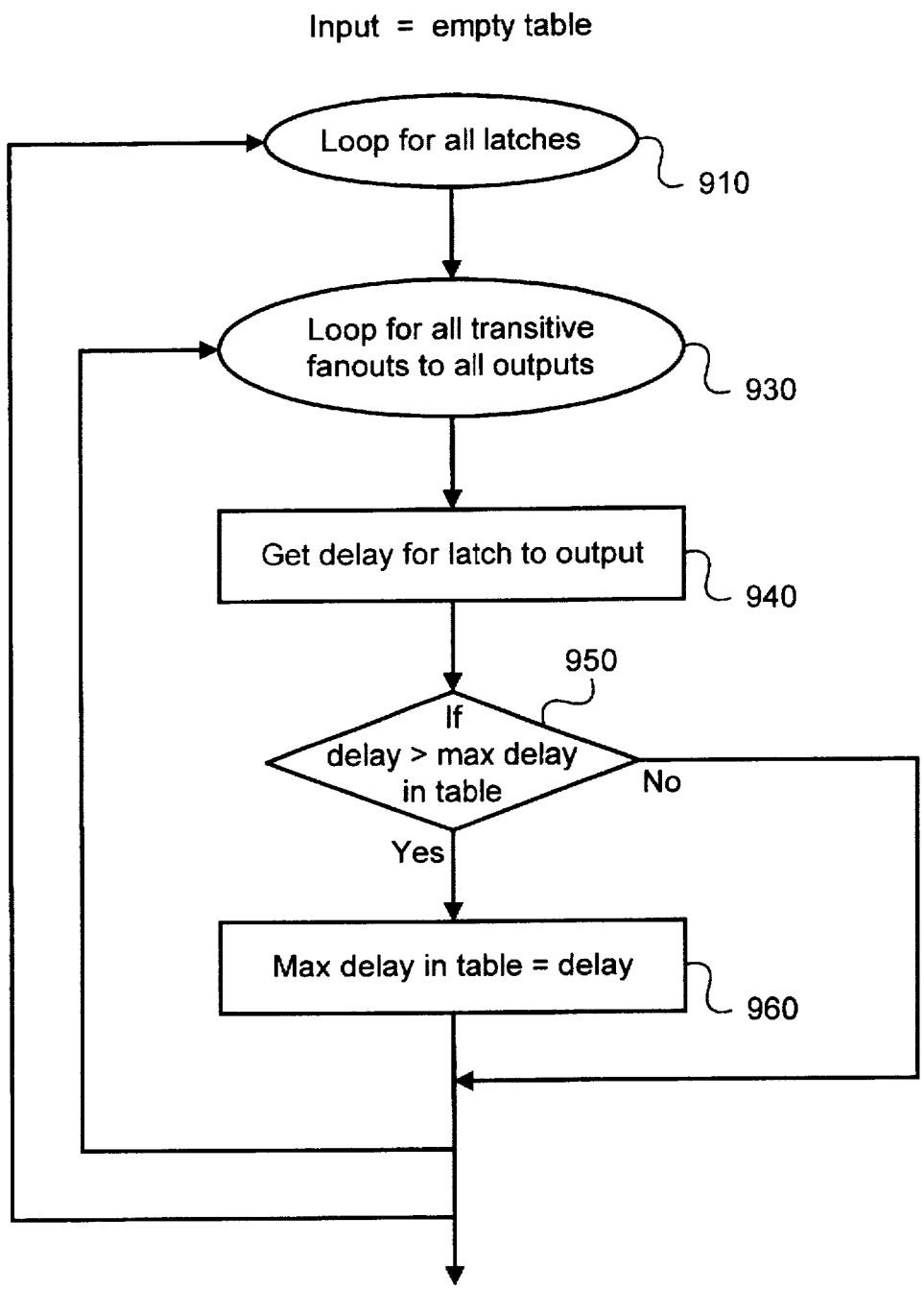
FIG. 11 is a flow chart showing steps for finding the minimum delay from each clock to each type of latch and output.

FIG. 11 is a flow chart showing steps for finding the maximum delay from each clock to output. The maximum delay from each clock to output is used to create the clock to Q arcs described in a previous section. These delays are precalculated and then used on the clock to Q arc of each output latch in the model to ensure that the minimum delay is modelled correctly. In one embodiment, the maximum delay is calculated using the intermediate model. In an alternate embodiment, the maximum delay can be calculated from the original circuit. The methods for using the intermediate model or the original circuit are the same.

The input to the routine is a digital circuit representation, and an empty hash table in memory 104 in which the clock to latch/output delays will be stored. The final structure of this table will have each clock as a key and the circuit's primary outputs as composite keys, and delay numbers as data. The delay numbers will be the maximum delay from the clock to the output specified by the key.

Loop 910 loops over each latch in the circuit. As each latch is processed, it is called the current latch. The clock which drives the current latch is called the current clock.

Loop 930 traces each branch of the transitive fanout of the current latch to the outputs of the circuit. As each output is processed, it is called the current output.

Step 940 gets the delay from the current clock to the current output. This delay is called the current delay.

Step 950 checks to see if the delay for this clock to output pair is more than the maximum delay stored in the clocks table. If it is, or if this clock to clock/output pair is not yet stored in the table, the current delay is placed in the table for this clock to output pair in step 960. Otherwise, the next output in the transitive fanout of the current latch is processed.

4.3 Model Initialization

Figure 12:
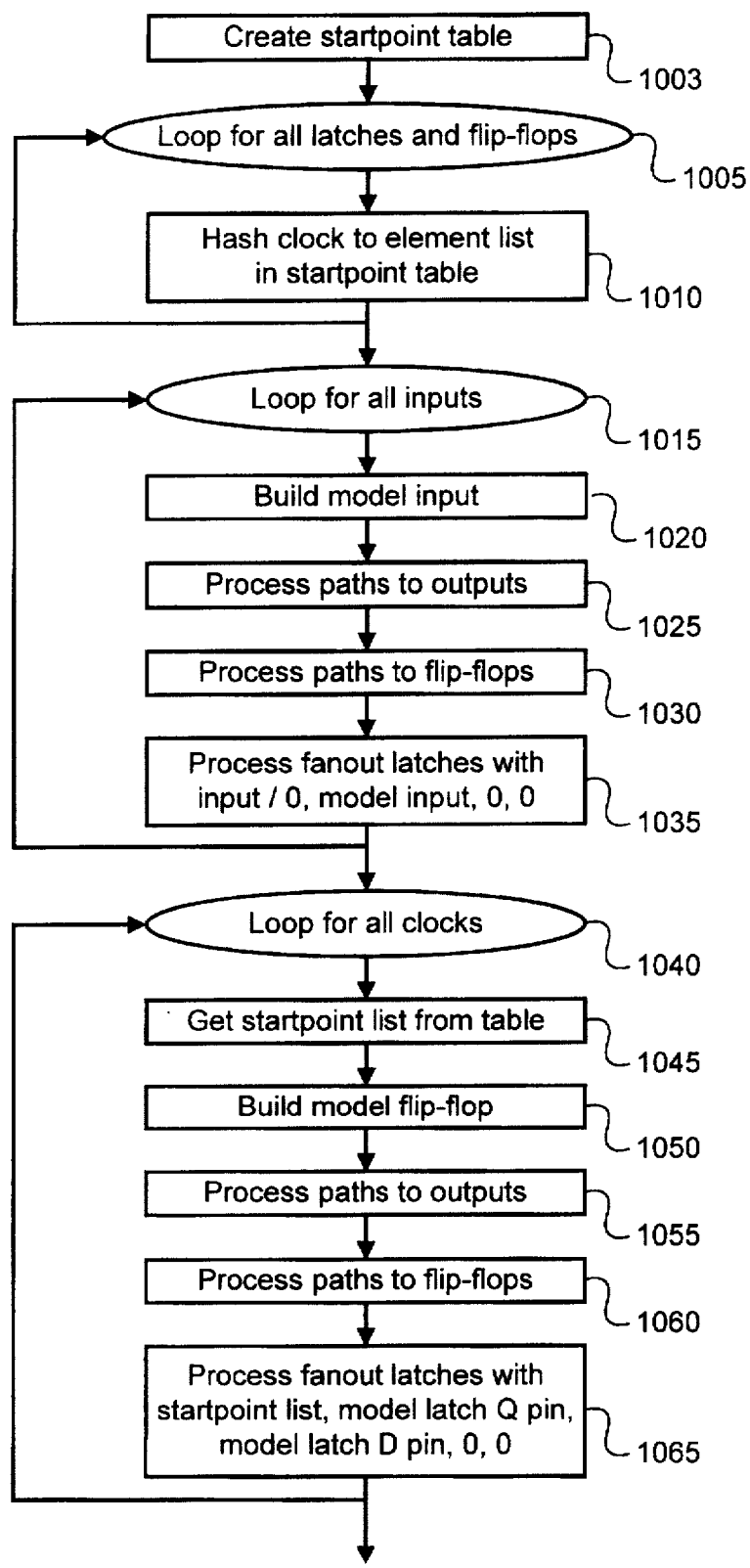
FIG. 12 is a flow chart showing steps for creating the first level of the model from the inputs of the digital circuit.
Figure 13B:
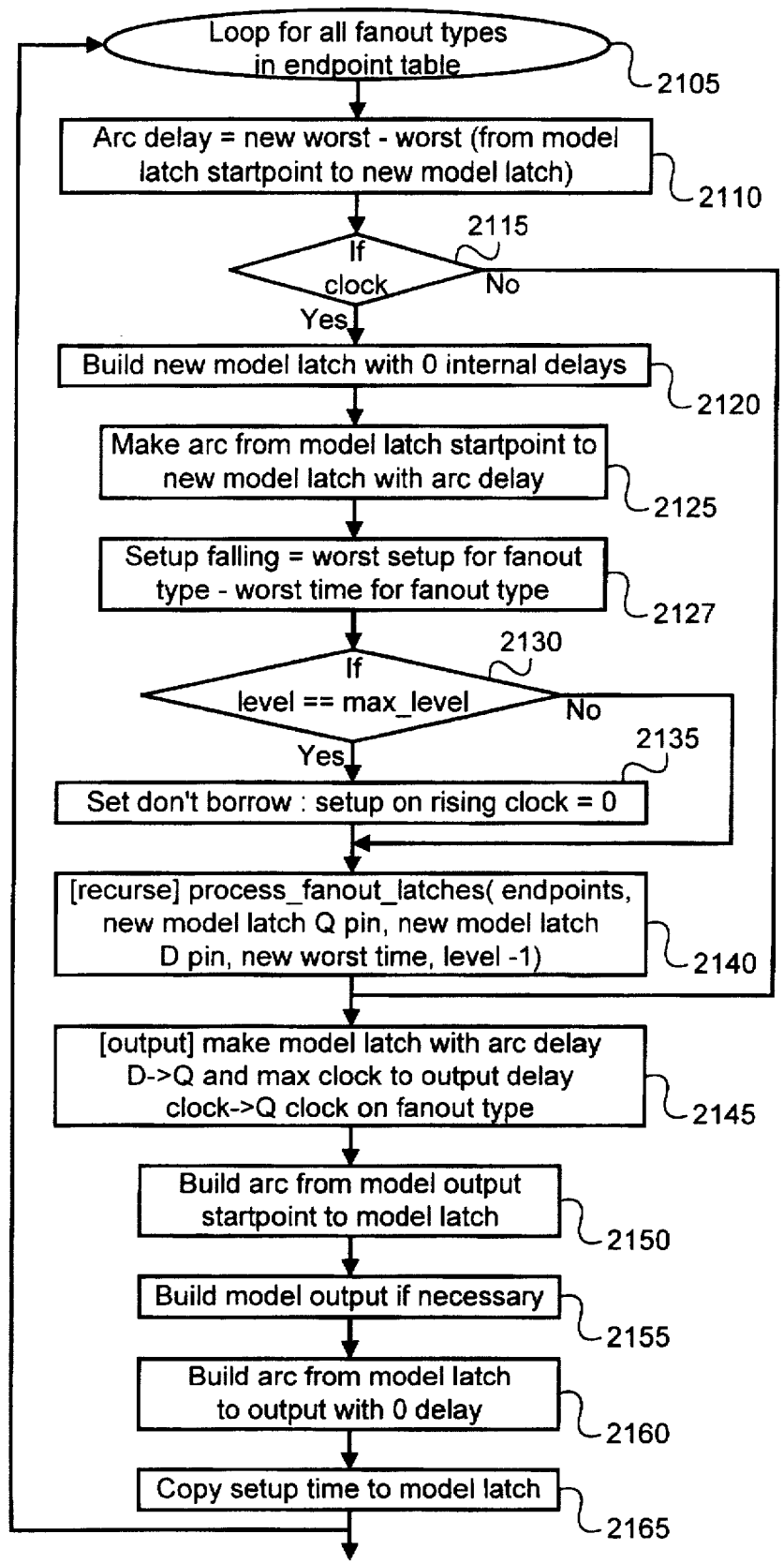

FIG. 12 is a flow chart showing steps for creating the first level of the model from the intermediate model. It will be apparent to one skilled in the art that the method of FIG. 12 can also use the digital circuit representation to create the first level of the model. The first level of the model is any path from an input, flip-flop, or latch to the first output, flip-flop, or latch on each branch of its transitive fanout. The input to the method shown in FIG. 12 is the intermediate model, such as the one shown in FIG. 9, created using the steps shown in FIG. 10. The method shown in FIG. 12 calls a routine "Process fanout latches." FIG. 13(a) and FIG. 13(b) are flow charts showing steps for the "Process fanout latches" routine which will be described in a subsequent section.

Step 1003 of FIG. 12 creates a startpoint table in memory 104. The startpoint table is a hash table which has clocks as keys, and latches and flip-flops as data. This hash table allows duplicates, so multiple latches or flip-flops can be entered for each clock.

Loop 1005 loops over all of the latches and flip-flops in the intermediate model. As each latch or flip-flop is processed it is called the current element.

Step 1010 hashes the current element, along with 0 for its cumulative delay, into the startpoint table using the clock for the current element as the key.

Loop 1015 loops over all of the inputs to the intermediate model. As each input is being processed, it is called the current input.

Step 1020 builds a model input corresponding to the current input.

Step 1025 processes all of the paths leading to outputs of the intermediate model. These paths are processed in a manner known to one of ordinary skill in the art. Briefly, these paths are processed by creating a model output if one does not already exist and then building an arc between the model input and the model output. A maximum as well as a minimum delay from the input to the output is put on the arc.

Step 1030 processes any paths leading to flip-flops of the intermediate model. These paths are also processed in a manner known to one of ordinary skill in the art as flip-flops on the same clock can be collapsed into a single flip-flop. Briefly, these paths are processed by creating a model flip-flop if one does not already exist and then building an arc between the model input and the model flip-flop. A maximum as well as a minimum delay from the input to the flip-flop is put on the arc.

Step 1035 calls the process fanout latches routine shown in FIG. 13 with the current input and 0 for the delay to that input, the model input, the model input, 0, and 0 as arguments. The formal arguments to the process fanout latches routine will be discussed in further detail the following section.

Loop 1040 loops over all of the clocks in the intermediate model. As each clock is processed, it is called the current clock.

Step 1045 gets the startpoint list for this clock from the startpoint table.

Step 1050 builds a model flip-flop which is clocked on the current clock. In an alternate embodiment, a model latch could be built. A model flip-flop may be used because no data signal drives the model flip-flop so no time borrowing is required.

Step 1055 processes any paths from the current clock to the outputs in a manner known to one of ordinary skill in the art.

Step 1060 processes any paths from the current clock to any flips-flops in a manner known to one of ordinary skill in the art.

Step 1065 calls the process fanout latches routine shown in FIG. 13 with the startpoint list, the model latch Q pin, the model latch D latch, 0, and 0 as arguments.

4.4 Completing the Model

FIG. 13(a) and FIG. 13(b) are flow charts showing steps for the process fanout latches routine which recurses through the circuit representation to create the remainder of the model. The inputs 1100 to the method are a startpoint list, a model latch startpoint, and model output startpoint, the worst time to the model latch and output startpoints, and the current level of the latch path being built. The startpoint list is a list of startpoints, which can be inputs, flip-flops, or latches, along with the cumulative delay to each startpoint. The model latch startpoint and the model output startpoint are both pins to which timing arcs for the next level of latches created should be connected. In the case of inputs, both of these startpoints are the input pin; for latches the model latch startpoint is the Q pin of the previous model latch, and the model output startpoint is the D pin of the previous model latch. Outputs use the D pin because the previous model latch must be bypassed in order to create an output model latch which drives only the output. Thus, the worst time to the startpoints will be used to calculate the delay for the next timing arcs. The current level is used to determine how deep the recursion is allowed to continue. Recursion stops once the current level reaches the maximum allowable level, which is the maximum latch path length as specified by the user.

Step 1103 creates the delay, setup, and endpoint hash tables. These hash tables are all keyed on fanout types. The fanout type is the clock if the current fanout is a latch, or the output if it is an output. The delay hash table's data is the largest, or worst, delay to each fanout type. The setup hash table's data is the largest, or worst, sum of the setup time and the delay to each fanout type. The endpoint hash table allows duplicates. Each fanout type's data is a list of all of the endpoints and the cumulative delay to each endpoint.

In one embodiment, loop 1105, step 1107, and step 1109 are performed if the original digital circuit is used as input. These steps are not used with the intermediate model.

Loop 1105 loops over all of the startpoints in the startpoint list. As each startpoint is being processed, it is called the current startpoint.

Step 1107 sets the arrival time of the current startpoint to be the delay associated with the current startpoint in the startpoint list.

Step 1109 times the circuit using a delay calculator.

Loop 1110 loops over all of the fanouts of all of the startpoints in the startpoint list. Note that when the intermediate model is used, all fanouts will be latches, flip-flops, or outputs. As each fanout is processed, it is called the current fanout. In this embodiment, each fanout may be processed more than once. Each fanout will be processed separately along with each startpoint which drives it. In this case, the startpoint under consideration is called the current startpoint, and the delay to the current startpoint is called the startpoint delay.

In an alternate embodiment in which the original circuit is processed directly, the transitive fanout of the current startpoint can be traced until a latch or output is found on each branch. It will be apparent to one skilled in the art that this tracing can be done more efficiently if the combinational logic in the original circuit has been previously levelized so that it can be traced breadth first from the startpoints.

Step 1115 gets the actual delay to the current fanout. In one embodiment, the actual delay is computed using the intermediate model by computing the sum of the startpoint delay plus the delay between the current startpoint and the current fanout. In another embodiment in which the original circuit is used, the actual delay is obtained from the delay calculator.

Step 1120 checks to see if the actual delay is the worst delay to the fanout type of the current fanout. If the actual delay is greater than the delay stored in the delay hash table for this fanout type or no delay is stored in the delay table for this fanout type, step 1125 hashes the actual delay with this fanout type in the delay table.

Step 1128 checks whether the current fanout is a latch or flip-flop. If not the method skips to step 1145. If so step 1130 calculates the current setup by summing the actual delay with the setup time on the current fanout.

Step 1135 checks to see if the current setup is worse, or larger than the setup time stored in the setup hash table. If so, or if no setup time is stored in the setup hash table for this fanout type, step 1140 hashes the current setup for this fanout type in the setup table. Both the worst rising setup and worst falling setup are stored in the setup hash table.

Step 1145 hashes a tuple of the current fanout and the actual delay into the endpoint hash table using the fanout type of the current fanout as the key. Because the endpoint hash table allows duplicate entries, many fanouts may be hashed for each fanout type. Effectively, this hash table creates a list of all of the fanouts at the current level for each fanout type.

The method of FIG. 13(a) is continued in FIG. 13(b).

Loop 2105 traverses the endpoint hash table, processing each fanout type and the list of endpoints associated with it. As each fanout type is processed, it is called the current fanout type; the associated endpoint list is the current endpoint list.

Step 2110 computes the arc delay which is the new worst delay for this fanout type from the delay hash table minus the worst delay which was passed into the routine.

Step 2115 checks if the current fanout type is a clock. If not, the routine skips to step 2130.

Otherwise, step 2120 builds a new model latch with zero for its internal delays from D to Q and clock to Q.

Step 2125 makes an arc from the model latch startpoint to the new model latch D pin and puts the arc delay on this arc.

Step 2127 sets the setup falling time and setup rising time on the new model latch to be the worst setup rising and setup falling respectively for the fanout type minus the worst time for the fanout type. The worst setup for the setup type is obtained from the setup hash table and the worst time is obtained from the delay hash table.

Step 2130 checks to see if the current fanout type is not an output and that the level is equal to the maximum level. If this condition is true, step 2135 sets the model latch so that it can't time borrow. In a preferred embodiment, this is done by setting the setup time on the rising clock to be 0. If the condition of step 2135 is not true, the method recurses to the next level of fanouts in step 2140.

The arguments for the recursion are the list of endpoints for the current fanout type, the new model latch Q pin, the new model latch D pin, the new worst time for the fanout type from the delay hash table and the current level plus one.

However, if the current fanout type is not a latch, it is assumed to be an output, and processing resumes with step 2145 following step 2115.

Step 2145 makes a model latch which is specific to the model output. The delay from D to Q is set to be the arc delay. The delay from clock to Q is set to be the maximum delay from the clock of the latch of the model output startpoint to the output of the current fanout type. Note that this delay is stored in the hash table created by the method whose steps are shown in FIG. 11.

Step 2150 builds an arc from the model output startpoint to the model latch D pin with 0 delay.

Step 2155 builds a model output if one does not already exist in the model.

Step 2160 builds and arc from the model latch Q pin to the model output with 0 delay.

Step 2165 copies the setup rising and setup falling time from the latch of the model output startpoint to the setup falling time of the model latch.

4.5 Example of Model Creation

This section shows how the model of FIG. 8 is created from the circuit representation of FIG. 6. In this example, the maximum latch path length is 2.

Notation of the form ((clock 1/o1, 47), (clock 2/o1, 73)) is used in the example. Items separated by a "/" are multiple items of a structure. A tuple in parentheses is a key data pair in a table, e.g. (key, data). Multiple key, data pairs in the same table are enclosed in a list with parentheses, e.g. ((key1, data1), (key2, data2)).

First, the intermediate model of FIG. 9 is created. A partial port-to-port model is created using prior art techniques. FIG. 14 shows the partial port-to-port intermediate model 1400 before the delta calculation is performed.

The method of FIG. 10 is used to adjust the deltas of each latch in the intermediate model. Loop 1310 of FIG. 10 loops over each of the latches of the intermediate model 1400. First, latch 1410 is processed. The delta for latch 1410 is calculated in step 1320 to be the delay of arc 1412 minus the delay of arc 1411 which is 1−3=−2. This delta is added to the delay of output arc 1413 in step 1330 to yield 8+−2=6 for the new delay of output arc 1413. The delta is then subtracted from input arc 1414 in step 1340 to yield 0−−2=2 for the new delay of input arc 1414. In step 1350, the delay of the D to Q arc 1411 is added to output arc 1413 to yield 6+3=9 as the final delay for output arc 1413. Finally, in step 1360, the delays of arcs 1411 and 1412 are replaced with zero. Loop 1310 then processes latch 1420, latch 1430, and latch 1440 in a similar fashion.

The method of FIG. 11 is then applied to the intermediate model to find the maximum delay from each clock to each output. Loop 910 loops over all of the latches in intermediate model 1400. First, latch 1410 is processed. Loop 930 loops over each branch of the transitive fanout from latch 1410 to the outputs. The first output processed is o1 1450. The delay from latch 1410 to o1 1450 is 12. Note that since the internal delays of all latches are 0, the delay from any pin in the latch may be used. Step 950 ascertains that there is no delay from clock 1, which is the clock for latch 1410, to o1 1450 in the table, so the tuple (clock 1/o1, 12) is added to the table in step 960. Next loop 910 processes latch 1420. In a similar fashion, the tuple (clock 2/o1, 3) is added to the table. When latch 1430 is processed, loop 930 first traces the transitive fanout to o1 and gets a delay of 10 in step 940. Step 950 finds that this delay is less than that already in the table. In the next iteration of loop 930, the delay to o2 1460 is 19. The tuple (clock1/o2, 19) is added to the table. Finally, loop 910 processes latch 1440. The delay from clock 2 to o2 1460, 14, added to the table. The final table in memory 104 is as follows:

((clock 1/o1, 12), (clock 1/o2, 19),
(clock 2/o1, 3), (clock2/o2, 14))

At the point, the final model can be created using the steps shown in FIG. 12 and FIG. 13.

Step 1003 of FIG. 12 creates the startpoint hash table. Loop 1005 then loops over all of the latches in the intermediate model, filling the startpoint table. At the completion of loop 1005 the two clocks in the design each have a list of latches and the startpoint table in memory 104 looks as follows:

((clock1, (latch 1410/0, latch 1430/0)),
(clock2, (latch 1420/0, latch 1440/0)))

Next, loop 1015 loops over all of the inputs in the intermediate model 1400. The first input processed is i1 1470. Step 1020 builds model input i1 810. Steps 1025 and 1030 do not do anything in this example, because there are no paths leading to either outputs or flip-flops from input i1 1470. Step 1035 calls the routine of FIG. 13, process fanout latches with the input i1 1470 and zero for its delay, the new model input i1 810, the new model input i1 810, zero for the cumulative delay, and 0 for the current model level.

The steps of FIG. 13(a) proceed as follows. Step 1103 creates delay, setup, and endpoint hash tables. Loop 1110 loops over all of the fanouts of input i1 1470. The first fanout is latch 1410. The actual delay to this fanout is 2 as found in step 1115. This is the worst delay to this fanout type (since it's the only one so far) and it is recorded in the delay table with clock1. Likewise the setup falling time of 2 (the delay to latch 1410)+0 (the setup of latch 1410)=2 is recorded in the setup table in step 1140. The latch has no setup rising time. Step 1145 hashes this endpoint and its delay latch 1410/2 in the endpoint table with clock1. Latch 1430 is processed in a similar fashion. At the end of loop 1105, the tables in memory 104 are as follows:

delay table: ((clock1, 2))
setup table: ((clock1, 2))
endpoint table: ((clock1, (latch 1410/2, latch 1430/2))

If the original circuit had been used in an alternate embodiment, the resulting tables would be the same. In this case, loop 1105 would process input i1 1470. Step 1107 would set input i1's 1470 arrival time to 0, and the delay calculator would be invoked in step 1109.

The method continues with the steps of FIG. 13(b). Loop 2105 traverses each fanout type in the endpoint hash table. Clock1 is the first fanout type. The arc delay is calculated to be 2 (from the delay hash table)−0 (passed in to the routine)=2. Step 2115 sees that this fanout type is a clock, and step 2120 builds model latch 840 with clock 1. Step 2125 adds arc 811 from model input i1 810 to model latch 840. Step 2127 sets the setup falling time of model latch 840 to be 2−2=0. Since the current level, 0, is not equal to the maximum level, 2, the routine recurses with the endpoint list for clock1, the new model latch 840 Q pin, the new model latch 840 D pin, the new worst time 2, and 1 for the next level in step 2140.

Again delay, setup and endpoint hash tables are created in step 1103 of FIG. 13(a). Loop 1110 executes in a similar fashion and fills the tables in memory 104 so that they include the following:

delay table: ((clock2, 11))
setup table: ((clock2, 13))
endpoint table: ((clock2, (latch 1420/11, latch 1440/7))

Step 2110 of FIG. 13(b) finds the arc delay to be 11−2=9. The tables are used to create model latch 865 in step 2120 and arc 844 is created with delay 9 in step 2125. The setup on the falling clock for model latch 865 is set to 0 in step 2127. In step 2140, the routine recurses once again with the endpoint list for clock2, model latch 865 Q pin, model latch 865 D pin, the new worst time 11, and 2 for the next level.

Yet again delay, setup and endpoint hash tables are created in step 1103 of FIG. 13(a). Loop 1110 executes in a similar fashion so that output o1 1450 is reached from latch 1420 and output o2 is reached from latch 1440. At the end of the loop, the tables in memory 104 include the following:

delay table: ((o1, 14), (o2, 21))
setup table: ()

endpoint table: ((o1, (o1, 14)), (o2, (o2, 21)))

Loop 2105 traverses the endpoint table. First, output o1 1450 is processed. The arc delay for o1 is 14−11=3. Since o1 1450 is not a clock, the routine skips to step 2145 and creates model latch 860 with a delay from D->Q of 3, and from clock->Q of 1 as determined from the maximum clock 1 to o1 1450 as determined above. Step 2150 builds arc 864 from the model output startpoint to model latch 860. Step 2155 builds model output o1 820 and step 2160 builds arc 863.

In the next iteration of loop 2105, model latch 890 is created in a similar fashion. Note that clock->Q arc 899 of model latch 890 gets a larger delay, 14, from the maximum clock to output delay table than the value of the delay calculated for D->Q arc 898, 10. This larger delay value ensures that the minimum delay is correct in model 800.

At this point, each recursive call to the process fanout latches routine returns and loop 1015 of FIG. 12 terminates because there are no additional inputs to intermediate model 1400. At this point, loop 1040 begins processing each of the clocks in intermediate model 1400. The startpoint list for the first clock, clock 1, is (latch 1410/0, latch 1430/0) as stored in the startpoint table which was created in loop 1005. Step 1050 creates model flip-flop 850. There are no paths from clock 1 to outputs or flip-flops. Step 1065 calls process fanout latches which executes in a similar fashion as described above to create model latch 875, model latch 870, and model latch 880.

The next iteration of loop 1040 processes clock 2. The startpoint list for clock 2 is (latch 1420/0, latch 1440/0) as stored in the startpoint table which was created in loop 1005. Step 1050 creates model flip-flop 885. Step 1055 process the paths to output o1 820 and output o2 830 to create arc 822 and arc 832 respectively. There are no paths to flip-flops or latches to process fanout latches is never called.

Thus, model 800 is created in memory 104. It includes all possible latch paths with length less than or equal to two in circuit 600. Model 800 allows for time borrowing along its latch paths. It accurately models the minimum delay to its outputs, and includes setup information in its latches. Although model 800 includes more latches than the original circuit 600, it will be apparent to one skilled in the art that a typical circuit, which would be impractical to use as an example, would include many more latches than circuit 600. Thus, many more latches would be collapsed into the latch chains of the final model, making it much smaller than the original circuit.

In the previous example, a latch path length of 2 was used. Because the longest latch path in circuit 600 is 2, the latch path length did not affect the model. Consider instead a latch path length of 1. The level and the max level are both 1 in step 2130 of FIG. 13(b) after latch 840 is built. Thus, step 2135 is executed to set don't borrow on latch 865. Step 2140 is not executed after latch 840 is built, so process fanout latches does not recurse and latch 860 and latch 890 are not created.

Although the preceding example actually creates more latches in the model than in the original circuit, it will be apparent to one skilled in the art that the described method will result in a substantial reduction of the number of latches in the model when typical circuits are modeled. Because the model contains latch paths, the effects of time borrowing between latches is properly modeled. By varying the maximum latch path length, the user can trade off the size of the model with the amount of time borrowing possible.

Other embodiments will be apparent to those skilled in the art from consideration of the specification and practice of the invention disclosed herein. It is intended that the specification and examples be considered as exemplary only, with the true scope of the invention being indicated by the following claims.

What is claimed is:

1. A model of a digital circuit, said model in a memory of a data processing system, the digital circuit having a first latch, a second latch and a third latch, a first clock pin of said first latch, a second clock pin of said second latch, a third clock pin of said third latch, and a clock signal driving said first clock pin, said second clock pin, and said third clock pin, said model comprising:

a model clock signal;

a collapsed first model latch representing said first latch of said digital circuit and said second latch of said digital circuit;

a first model clock pin of said first model latch driven by said model clock signal;

a second model latch representing said third latch of said digital circuit;

a second model clock pin of said second model latch driven by said model clock signal;

means for verifying timing of said collapsed first model latch; and means for enabling time borrowing while verifying timing of said collapsed first model latch.

2. A model of a digital circuit, said model in a memory of a data processing system, the digital circuit having a first latch, a second latch and a third latch, a first clock pin of said first latch, a second clock pin of said second latch, a third clock pin of said third latch, said first latch driving said second latch and said third latch, and a clock signal driving said first clock pin, said second clock pin, and said third clock pin, said model comprising:

a model clock signal;

a first model latch representing said first latch of said digital circuit;

a first model clock pin of said first model latch driven by said model clock signal;

a collapsed second model latch representing said second latch of said digital circuit and said third latch of said digital circuit;

a second model clock pin of said second model latch driven by said model clock signal;

means for verifying timing of said collapsed second model latch; and means for enabling time borrowing while verifying timing of said collapsed second model latch.

3. The model of claim 1 or claim 2 further comprising:

a timing arc between said first model latch and said collapsed second model latch.

4. The model of claim 3 further comprising:

a delay value on said timing arc.

5. The model of claim 3 further comprising:

a model data pin of said first model latch;

a clock to data timing arc between said first model clock pin and said model data pin of said first model latch; and a model setup delay value on said clock to data timing arc.

6. The model of claim 5 wherein said model setup delay value is on the falling edge of said clock.

7. The model of claim 5 wherein said model setup delay value is on the rising edge of said clock.

8. The model of claim 4, said digital circuit having a setup delay on said second latch, said model further comprising:

a model data pin of said second model latch;

a clock to data timing arc between said second model clock pin and said model data pin of said second model latch; and a model setup delay on said clock to data timing arc, wherein said model setup delay is equal to the sum of a cumulative delay from said first latch to said second latch and said setup delay minus said delay value.

9. The model of claim 1 or claim 2 further comprising:

a third model latch clocked by said model clock signal;

a delay to said third model latch wherein said delay is the minimum delay to any latch of said digital circuit clocked by said clock signal.

10. The model of claim 1 or claim 2 wherein said digital circuit also includes a first input, said first input driving said first latch, said model further comprising:

a model input representing said first input, said model input driving said first model latch.

11. A method, performed by a data processing system having a memory, comprising the steps of:

identifying a first latch in a digital circuit which is clocked by a clock;

building, in said memory, a first model latch representing the first latch and clocked by a model clock;

tracing a first branch of a transitive fanout from said first latch to a second latch clocked by said clock;

tracing a second branch of said transitive fanout from said first latch to a third latch clocked by said clock;

storing in said memory a maximum delay of a first delay from said first latch to said second latch and a second delay from said first latch to said third latch;

building a collapsed second model latch representing the second latch and the third latch in said memory clocked by said model clock;

building a timing arc between said first model latch and said second model latch;

annotating said timing arc with said maximum delay;

verifying timing of said collapsed second model latch; and enabling time borrowing while verifying timing of said collapsed second model latch.

12. A method performed by a data processing system having a memory, comprising the steps of:

identifying a first set of latches in a digital circuit which are clocked by a first clock;

building a collapsed first model latch representing the first set of latches and clocked by a first model clock;

identifying a collapsed second set of latches clocked by a second clock from the combined transitive fanout of said first set;

determining a maximum delay between any latch of said first set and any latch of said second set;

building a collapsed second model latch representing the second set of latches and clocked by a second model clock;

building a first timing arc between said first model latch and said second model latch;

annotating said timing arc with said maximum delay;

verifying timing of said collapsed first and collapsed second model latches; and enabling time borrowing while verifying timing of said collapsed first and collapsed second mode latches.

13. A method performed by a data processing system having a memory, comprising the steps of:

identifying a first set of latches in a digital circuit which are clocked by a clock;

building a collapsed first model latch representing said first set of latches and clocked by a model clock;

comparing a latch path length of a latch path ending at said collapsed first model latch to a maximum latch path length;

if said latch path length is greater than or equal to said maximum latch path length, then annotating said first model latch such that it is not capable of time borrowing;

verifying timing of the collapsed first model latch; and enabling time borrowing when the collapsed first model latch is capable of time borrowing.

14. A model of a digital circuit having plural latches clocked by a clock, the model stored in a memory of a data processing system, comprising:

a model collapsed latch;

means for collapsing at least some of the plural latches clocked by the clock into the model collapsed latch, wherein a plurality of the latches clocked by the clock in the a digital circuit is represented by the model collapsed latch in the model;

means for verifying timing of said model collapsed latch;

means for enabling time borrowing while verifying timing of said model collapsed latch.

15. A model of a digital circuit in a memory of a data processing system comprising:

a first model latch representing a first latch of said digital circuit;

a second collapsed model latch representing a first plurality of latches of said digital circuit, wherein said first model latch drives said second collapsed model latch and is capable of time borrowing from said second collapsed model latch; and means for enabling time borrowing while verifying timing of said second collapsed model latch.

16. A model of a digital circuit, said model in a memory of a date processing system, said model having a first latch, a second latch, a third latch, a fourth latch, a first clock pin of said first latch, a second clock pin of said second latch, a third clock pin of said third latch, a fourth clock pin of said fourth latch, said first latch driving said second latch, and said third latch, a first clock signal driving said first clock pin and said fourth clock pin, and a second clock signal driving said second clock pin and said third clock pin, said model comprising:

a first model clock signal;

a second model clock signal;

a first model latch representing said first latch of said digital circuit;

a first model clock pin of said first model latch driven by said first model clock signal;

a collapsed second model latch representing said second latch of said digital circuit and said third latch of said digital circuit;

a second model clock pin of said collapsed second model latch driven by said second model clock signal;

a third model latch representing said fourth latch of said digital circuit;

a third model clock pin of said third model latch driven by said first model clock signal;

means for verifying timing of the collapsed second model latch; and means for enabling time borrowing while verifying timing of the collapsed second model latch.

17. A model of a digital circuit, said model in a memory of a data processing system, said model having a first latch, a second latch, a third latch, a first clock pin of said first latch, a second clock pin of said second latch, a third clock pin of said third latch, said first latch driving said third latch, said second latch driving said third latch, a first clock signal driving said first clock pin and said second clock pin, and a second clock signal driving said third clock pin, said model comprising:

a first model clock signal;

a second model clock signal;

a collapsed first model latch representing said first latch of said digital circuit and said second latch of said digital circuit wherein said collapsed first model latch is capable of time borrowing;

a first model clock pin of said collapsed first model latch driven by said first model clock signal;

a second model latch representing said third latch of said digital circuit;

a second model clock pin of said second model latch driven by said second model clock signal;

a timing arc between said collapsed first model latch and said second model latch;

means for verifying timing of the collapsed first model latch; and means for enabling time borrowing while verifying timing of the collapsed first model latch.

18. The model of claim 17 wherein said second model latch is capable of time borrowing.

19. A method performed by a data processing system having a memory, comprising the steps of:

identifying a first latch in a digital circuit which is clocked by a first clock;

building a first model latch representing said first latch and clocked by a first model clock;

tracing a first branch of a transitive fanout from said first latch to a second latch clocked by a second clock;

tracing a second branch of said transitive fanout from said first latch to a third latch clocked by said second clock;

determining a maximum delay of a first delay from said first latch to said second latch and a second delay from said first latch to said third latch;

building a collapsed second model latch representing said second latch and said third latch and clocked by a second model clock;

building a timing arc between said first model latch and said collapsed second model latch;

annotating said timing arc with said maximum delay;

annotating said first model latch such that it is capable of time borrowing;

annotating said collapsed second model latch such that it is capable of time borrowing;

verifying the timing of the collapsed second model latch; and enabling time borrowing while verifying timing of the collapsed second model latch.

20. The method of claim 19 further comprising the steps of:

verifying the timing of said model wherein said verification uses time borrowing.

21. A method performed by a data processing system having a memory, comprising the steps of:

identifying a first set of latches in a digital circuit which are clocked by a first clock;

building a collapsed first model latch representing said first set of latches and clocked by a first model clock;

identifying a second set of latches clocked by a second clock from the combined transitive fanout of said first set;

determining a maximum delay between any latch of said first set and any latch of said second set;

building a collapsed second model latch representing said second set of latches and clocked by a second model clock;

building a first timing arc between said collapsed first model latch and said collapsed second model latch;

annotating said timing arc with said maximum delay;

annotating said collapsed first model latch such that it is capable of time borrowing;

annotating said collapsed second model latch such that it is capable of tine borrowing;

verifying the timing of the collapsed first and collapsed second model latches; and enabling time borrowing while verifying the timing of the collapsed first and collapsed second model latches.

22. A model in a memory of a data processing system of a digital circuit, the digital circuit having a first latch, a second latch and a third latch, a first clock pin of said first latch, a second clock pin of a said second latch, a third clock pin of said third latch, a clock signal driving said first clock pin, said second clock pin, and said third clock pin, a first input, said first input driving said first latch, a second input, said second input driving said second latch and said third latch, said model comprising:

a model clock signal;

a first model latch representing said first latch;

a first model clock pin of said first model latch driven by said model clock signal;

a collapsed second model latch representing said second latch and said third latch;

a second model clock pin of said collapsed second model latch driven by said model clock signal;

a first model input representing said first input of said digital circuit;

a second model input representing said second input of said digital circuit;

a first model arc connecting said first model input and said first model latch;

a second model arc connecting said second model input and said collapsed second model latch;

means for verifying the timing of the collapsed second model latch; and means for enabling time borrowing while verifying the timing of the collapsed second model latch.

* * * * *

UNITED STATES PATENT AND TRADEMARK OFFICE
CERTIFICATE OF CORRECTION

PATENT NO. : 5,790,830
DATED : August 4, 1998
INVENTOR(S) : Segal

It is certified that error appears in the above-identified patent and that said Letters Patent is hereby corrected as shown below:

Column 19, Line 65 should read -- model -- instead of "mode."

Signed and Sealed this

Eighth Day of December, 1998

Attest:

BRUCE LEHMAN

Attesting Officer

Commissioner of Patents and Trademarks